United States Patent
Li et al.

(10) Patent No.: US 10,475,996 B2
(45) Date of Patent: Nov. 12, 2019

(54) OPTICAL-READOUT SYNAPTIC DEVICE BASED ON $SiO_xN_y$ AND PREPARATION METHOD THEREOF

(71) Applicant: University of Electronic Science and Technology of China, Chengdu, Sichuan (CN)

(72) Inventors: Wei Li, Sichuan (CN); Yicheng Chen, Sichuan (CN); Dongyang Li, Sichuan (CN); Hao Zhong, Sichuan (CN); Deen Gu, Sichuan (CN); Yadong Jiang, Sichuan (CN)

(73) Assignee: University of Electronic Science and Technology of China, Chengdu, Sichuan (CN)

( * ) Notice: Subject to any disclaimer, the term of this patent is extended or adjusted under 35 U.S.C. 154(b) by 0 days.

(21) Appl. No.: 15/989,188

(22) Filed: May 25, 2018

(65) Prior Publication Data

US 2018/0277756 A1    Sep. 27, 2018

(30) Foreign Application Priority Data

Dec. 14, 2017    (CN) .......................... 2017 1 1335085

(51) Int. Cl.
*H01L 45/00*    (2006.01)
*G02B 6/122*    (2006.01)
(Continued)

(52) U.S. Cl.
CPC ........ *H01L 45/1233* (2013.01); *G02B 6/1226* (2013.01); *G02B 6/132* (2013.01);
(Continued)

(58) Field of Classification Search
CPC .................................................. H01L 45/1233
See application file for complete search history.

(56) References Cited

U.S. PATENT DOCUMENTS

| | | | | |
|---|---|---|---|---|
| 2010/0278479 A1* | 11/2010 | Bratkovski | ........ | G02B 6/12007 385/31 |
| 2016/0049215 A1* | 2/2016 | Dionne | .................. | G21K 1/006 250/251 |

* cited by examiner

*Primary Examiner* — William A Harriston

(57) ABSTRACT

An optical-readout synaptic device based on $SiO_xN_y$ and a preparation method thereof are provided. The device includes a surface plasmonic waveguide and a memristor; the surface plasmonic waveguide has a vertical three-layer structure that a second metal layer, a $SiN_x$ dielectric layer and a first metal layer are successively arranged from top to bottom; the memristor has a vertical four-layer structure that a second electrode layer, a second resistive layer, a first resistive layer and a first electrode layer are successively arranged from top to bottom; the memristor is embedded in the surface plasmonic waveguide; and, the first resistive layer and the second resistive layer of the memristor serve as an optical signal transmission channel that is horizontally connected with the $SiN_x$ dielectric layer of the surface plasmonic waveguide. The present invention realizes an optical-readout of synaptic weight and has incomparable advantages over a conventional electrical-readout synaptic device.

7 Claims, 1 Drawing Sheet

(51) Int. Cl.
    *G02B 6/132*       (2006.01)
    *G06N 3/063*       (2006.01)
    *B82Y 20/00*        (2011.01)
    *G02B 6/12*         (2006.01)

(52) U.S. Cl.
    CPC ....... *G06N 3/0635* (2013.01); *H01L 45/1253* (2013.01); *H01L 45/145* (2013.01); *H01L 45/1625* (2013.01); *H01L 45/1675* (2013.01); *B82Y 20/00* (2013.01); *G02B 2006/12035* (2013.01)

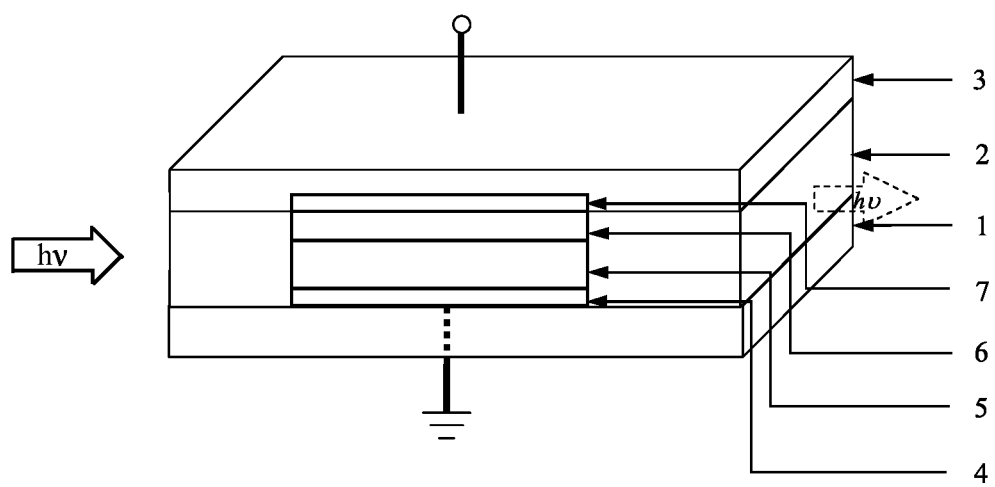

OPTICAL-READOUT SYNAPTIC DEVICE BASED ON $SiO_xN_y$ AND PREPARATION METHOD THEREOF

CROSS REFERENCE OF RELATED APPLICATION

The application claims priority under 35 U.S.C. 119(a-d) to CN 201711335085.9, filed Dec. 14, 2017.

BACKGROUND OF THE PRESENT INVENTION

Field of Invention

The present invention relates to technical fields of silicon-based photonic integrated device combined with neuromorphic chip, and more particularly to an optical-readout synaptic device based on $SiO_xN_y$ and a preparation method thereof.

Description of Related Arts

For a memristor having a sandwich structure of metal/(dielectric layer)/metal, if being exerted by different bias voltages, the resistance value of the device will change nonlinearly. The nonlinear change of the resistance is caused by the formation or disappearance of the electric channel in the dielectric layer under the different bias voltages. However, the connection strength of the nanoscale filamentous electric channel will change with the amplitude and the action time of the bias voltage. Interestingly, this operation characteristic is similar as the working mechanism of the synapses connected with the different nerve cells in the biological neural system. Because of the similarity between the memristor and the synapses of the biological system, the memristor is suitable to serve as the synaptic device for constructing the neuromorphic bionic-brain chip and further for the artificial neural network. It is confirmed by the researches that the bionic synapse based on the memristor is the nearest bionic device to the synapses in the biological neural system until now.

The memristor provides an excellent bionic synaptic device for the artificial neural network. However, the conventional bionic synaptic device based on the memristor reads the synaptic weight of the synaptic device with the electric signal, and the process is called the electrical-readout. The electrical-readout memristive bionic synapse has the small transmission bandwidth and the large interference among the signals. In comparison, reading the synaptic weight with the optical signal (amplitude and phase) as the information medium, which is called the optical-readout, has the incomparable advantages over the electrical-readout, such as the large transmission bandwidth and the excellent parallel signal processing capacity. However, until now, all of the published related documents about the synaptic device based on the memristor effect are based on the electrical-readout bionic synapse.

The Chinese patent publication of CN 104916313A disclosed a neural network synaptic structure based on electrical-readout memristive devices, comprising a first memristive device, a second memristive device, a voltage inverter, an operational amplifier and a feedback resistance.

The Chinese patent publication of CN 105287046A disclosed a full carbon-based electrical-readout neural synaptic bionic device and a production method thereof. The full carbon-based neural synaptic bionic device comprises a substrate, a bottom electrode on the substrate, a resistive functional layer on the bottom electrode and a top electrode on the resistive functional layer, wherein the bottom electrode and the top electrode are made of graphene; and the resistive functional layer is made of graphene oxide.

The Chinese patent publication of CN 105304813A disclosed an electrical-readout neural synaptic bionic device and a preparation method thereof. The neural synaptic bionic device comprises a substrate, a bottom electrode on the substrate, a resistive functional layer on the bottom electrode and a top electrode on the resistive functional layer, wherein the resistance transformation layer comprises an upper oxide layer, a lower oxide layer, and metal nanoparticles between the upper and lower oxide layers.

The Chinese patent publication of CN 104934534A disclosed an electrical-readout biological neural synaptic bionic electron device and a preparation method thereof. The biological neural synaptic bionic electron device from top to bottom successively comprises an upper electrode, a middle insulation layer connected with the upper electrode and a lower electrode connected with the middle insulation layer, wherein: the upper electrode is made of titanium; and the middle insulation layer is made of metallic oxide.

The Chines patent publication of CN 104376362B disclosed an electrical-readout synaptic device for the artificial neural network. The artificial neural network comprises multiple nerve cells; the nerve cells are connected with each other through the synaptic device array; the synaptic device array comprises multiple synaptic devices; and each synaptic device comprises at least two synaptic units which are connected in parallel.

The present invention provides a bionic synaptic device based on the optical-readout.

SUMMARY OF THE PRESENT INVENTION

An object of the present invention is to provide an optical-readout synaptic device based on $SiO_xN_y$, which is an optical-readout synaptic device based on a memristive effect, wherein light serves as a signal medium, and a synaptic weight is represented by an intensity and a phase of the light. Therefore, the device breaks a bandwidth limit of signal processing of a conventional synaptic device with electrical-readout and has a good parallel signal processing capacity.

In order to accomplish the above object, following technical solutions are provided by the present invention.

An optical-readout synaptic device based on $SiO_xN_y$ comprises a surface plasmonic waveguide and a memristor, wherein:

the surface plasmonic waveguide has a vertical three-layer structure that a second metal layer, a $SiN_x$ dielectric layer and a first metal layer are successively arranged from top to bottom;

the memristor has a vertical four-layer structure that a second electrode layer, a second resistive layer, a first resistive layer and a first electrode layer are successively arranged from top to bottom; and the memristor is embedded in the surface plasmonic waveguide, wherein: the first resistive layer and the second resistive layer of the memristor serve as an optical signal transmission channel that is horizontally connected with the $SiN_x$ dielectric layer of the surface plasmonic waveguide.

Preferably, both of the first electrode layer and the second electrode layer are made of noble platinum electrodes.

Further preferably, both of the first electrode layer and the second electrode layer of the memristor are made of the noble platinum electrodes, which are obtained through a physical vapor deposition method with a thickness of 10-20 nm and a width equal to a width of the surface plasmonic waveguide.

Preferably, the first resistive layer is an intrinsic $SiO_xN_y$ film.

Further preferably, the first resistive layer is an intrinsic $SiO_xN_y$ film, which is obtained through a magnetron sputtering method and has a thickness of 30-50 nm.

Preferably, the second resistive layer is a $SiO_xN_y$ film containing metal nanoparticles.

Further preferably, the metal nanoparticles are silver nanoparticles, copper nanoparticles or aluminum nanoparticles, wherein the silver nanoparticles are preferred.

Preferably, the second resistive layer is a $SiO_xN_y$ film containing metal nanoparticles, which is obtained through a co-sputtering method combined with a standard CMOS (Complementary Metal-Oxide-Semiconductor) process, wherein: the second resistive layer has a thickness of 10-30 nm; and a content of the metal nanoparticles is 30-45% of a volume of the $SiO_xN_y$ film.

Further preferably, the metal nanoparticles are silver nanoparticles, copper nanoparticles or aluminum nanoparticles, wherein the silver nanoparticles are preferred.

Preferably, both of the first metal layer and the second metal layer are silver layers.

Preferably, a top part of the second electrode layer is located inside the second metal layer, so that loss of a part of optical signals is decreased.

Another object of the present invention is to provide a method for preparing the above optical-readout synaptic device based on $SiO_xN_y$.

In order to accomplish the object, following technical solutions are provided by the present invention.

A method for preparing an optical-readout synaptic device based on $SiO_xN_y$ comprises steps of:

(1), preparing a single crystal silicon wafer, then washing and drying the single crystal silicon wafer;

(2), forming a patterned first metal layer on the single crystal silicon wafer through a physical vapor deposition method and a metal lift-off process;

(3), through the physical vapor deposition method and photolithographing, obtaining a $SiN_x$ waveguide dielectric layer above the first metal layer, wherein a memristor window is reserved in the waveguide dielectric layer;

(4), through photolithographing, obtaining four layers of a memristor inside a surface plasmonic waveguide, respectively a first electrode layer, a first resistive layer, a second resistive layer and a second electrode layer, wherein the first electrode layer is obtained through a direct current sputtering method; the first resistive layer is a $SiO_xN_y$ film obtained through a reactive magnetron sputtering method; the second resistive layer is a $SiO_xN_y$ film containing metal nanoparticles and is obtained through a co-sputtering method; and the second electrode layer is obtained through the direct current sputtering method;

(5), through the physical vapor deposition method and the metal lift-off process, forming a second metal layer of the surface plasmonic waveguide; and (6), through a conventional RIE (Reactive Ion Etching) process, removing residual photoresist; then washing and drying, and obtaining the optical-readout synaptic device based on $SiO_xN_y$.

Basic working principles of the present invention are described as follows. When a forward voltage is exerted between the first electrode layer and the second electrode layer of the device (namely an electrical modulation process), the metal nanoparticles in the second resistive layer transfer to the first resistive layer under an electric field effect, so that a distribution of the metal nanoparticles in the resistive layers of the memristor is reconfigured. After the light transmitted in the surface plasmonic waveguide interacts with the reconfigured resistive layers of the memristor, the transmitted light has the attenuated amplitude and the delayed phase, so that the synaptic weight modulation (namely the optical-readout) is realized. When a backward voltage is further exerted between the first electrode layer and the second electrode layer of the device (namely the electrical modulation process), the transferred metal nanoparticles in the first resistive layer return back to the second resistive layer under the electric field effect, and the distribution of the metal nanoparticles in the resistive layers of the memristor is reconfigured again, so that the intensity and the phase of the modulated light are recovered. Obviously, in a period of the electrical modulation, a change degree of the optical-readout memristive synaptic weight has a one-to-one correspondence with the exerted voltage.

The present invention has following beneficial effects. Based on the vertical four-layer structure of metal/(double resistive layers)/metal of the memristor, combined with the three-layer structure of metal/($SiN_x$ dielectric layer)/metal of the surface plasmonic waveguide, the present invention realizes the optical-readout of the synaptic weight. Because the optical signals are able to be transmitted in parallel and have the large bandwidth, the optical-readout synaptic device with the amplitude and phase of the optical signals as the synaptic weight has the incomparable advantages over the conventional synaptic device with the resistance as the synaptic weight. More importantly, the surface plasmonic waveguide enables the optical signals to transmit with breaking the diffraction limit, which is beneficial to the further decrease of the device size.

BRIEF DESCRIPTION OF THE DRAWINGS

In order to illustrate the technical solutions provided by the preferred embodiments of the present invention more clearly, the accompanying drawings for describing the preferred embodiments are simply described as follows. Obviously, the accompanying drawings in the following description are only some embodiments of the present invention, and persons of ordinary skill in the art can derive other drawings from the accompanying drawings without creative efforts.

The FIGURE is a sketch view of structural principles of an optical-readout synaptic device based on $SiO_xN_y$ according to preferred embodiments of the present invention.

In the FIGURE: 1: first metal layer; 2: $SiN_x$ dielectric layer; 3: second metal layer; 4: first electrode layer; 5: first resistive layer; 6: second resistive layer; and 7: second electrode layer.

DETAILED DESCRIPTION OF THE PREFERRED EMBODIMENT

The preferred embodiments of the present invention are described with the accompanying drawings as follows. One skilled in the art can easily know other advantages and beneficial effects of the present invention from the disclosed content of the specification. The present invention can be implemented and applied through other different embodiments. The details in the specification can be modified and changed based on the different viewpoints and applications without departing from the spirit of the present invention.

First Preferred Embodiment

As shown in the figure, according to the first preferred embodiment of the present invention, an optical-readout synaptic device based on $SiO_xN_y$ comprises a surface plasmonic waveguide and a memristor, wherein:

the surface plasmonic waveguide has a vertical three-layer structure that a second metal layer 3, a $SiN_x$ dielectric layer 2 and a first metal layer 1 are successively arranged from top to bottom;

the memristor has a vertical four-layer structure that a second electrode layer 7, a second resistive layer 6, a first resistive layer 5 and a first electrode layer 4 are successively arranged from top to bottom; and the memristor is embedded in the surface plasmonic waveguide, wherein: the first resistive layer 5 and the second resistive layer 6 of the memristor serve as an optical signal transmission channel that is horizontally connected with the $SiN_x$ dielectric layer 2 of the surface plasmonic waveguide.

A top part of the second electrode layer 7 is located inside the second metal layer 3, so that loss of a part of optical signals is decreased.

In the first preferred embodiment, the first resistive layer 5 is an intrinsic $SiO_xN_y$ film, which is obtained through a magnetron sputtering method combined with a standard CMOS (Complementary Metal-Oxide-Semiconductor) process and has a thickness of 30 nm.

The second resistive layer 6 is a $SiO_xN_y$ film containing silver nanoparticles, wherein: the second resistive layer has a thickness of 10 nm; and a content of the silver nanoparticles is 30% of a volume of the $SiO_xN_y$ film.

Both of the first electrode layer 4 and the second electrode layer 7 are made of noble platinum electrodes.

The first metal layer 1 and the second metal layer 3 are both silver layers, which are obtained through a physical vapor deposition method combined with the standard CMOS process and have a thickness of 100 nm and a width equal to a width of the surface plasmonic waveguide.

The first preferred embodiment further provides a method for preparing the above optical-readout synaptic device based on $SiO_xN_y$, comprising steps of:

(1), preparing a single crystal silicon wafer, then washing and drying the single crystal silicon wafer;

(2), forming a patterned first metal layer 1 on the single crystal silicon wafer through a physical vapor deposition method and a metal lift-off process, wherein the first metal layer 1 has a length of 10 μm, a width of 0.8 μm and a height of 0.1 μm; and the first metal layer 1 is embodied as a silver layer;

(3), coating a layer of photoresist on a surface of the first metal layer 1, and processing with photolithographing and developing through a photomask, so as to realize a memristor window having a length of 5 μm and a width of 0.8 μm; through a plasma enhanced chemical vapor deposition (PECVD) method, depositing a $SiN_x$ film with a thickness of 50 nm on the coated and patterned first metal layer 1 to serve as a waveguide dielectric layer; and, through a lift-off process, obtaining the waveguide dielectric layer above the first metal layer 1, wherein: the waveguide dielectric layer has a length of 10 μm, a width of 0.8 μm and a height of 0.05 μm; and the memristor window with a length of 5 μm and a width of 0.8 μm is reserved in the waveguide dielectric layer;

(4), forming a photoresist pattern outside a memristor area through photolithographing; successively depositing a first electrode layer 4, a first resistive layer 5, a second resistive layer 6 and a second electrode layer 7 of a memristor, wherein the first electrode layer 4 is made of noble platinum electrode, which has a thickness of 10 nm and is obtained through a direct current sputtering method; the first resistive layer 5 is an intrinsic $SiO_xN_y$ film, which has a thickness of 30 nm and is obtained through a reactive magnetron sputtering method; the second resistive layer 6 is a $SiO_xN_y$ film containing silver nanoparticles, which has a thickness of about 10 nm and a silver content of 35% (volume percentage) and is obtained through a co-sputtering method; and the second electrode layer 7 is made of noble platinum electrode, which has a thickness of 10 nm and is obtained through the direct current sputtering method; removing the four layers through the lift-off process, and obtaining the memristor inside a surface plasmonic waveguide;

(5), through the physical vapor deposition method and the metal lift-off process, forming a second metal layer 3 of the surface plasmonic waveguide, wherein the second metal layer is embodied as a silver layer having a thickness of 0.1 μm; and (6), through a conventional RIE (Reactive Ion Etching) process, removing the residual photoresist; then washing and drying, and obtaining the optical-readout synaptic device based on $SiO_xN_y$.

Basic working principles of the first preferred embodiment are described as follows. When a forward voltage is exerted between the second electrode layer 7 and the first electrode layer 4 of the device (namely an electrical modulation process), the silver nanoparticles in the second resistive layer 6 transfer to the first resistive layer 5 under an electric field effect, so that a distribution of the silver nanoparticles in the resistive layers of the memristor is reconfigured. After the light (hv) transmitted in the surface plasmonic waveguide interacts with the reconfigured resistive layers of the memristor, the transmitted light (hv) has the attenuated amplitude and the delayed phase, so that the synaptic weight modulation (namely the optical-readout) is realized. When a backward voltage is further exerted between the second electrode layer 7 and the first electrode layer 4 of the device (namely the electrical modulation process), the transferred silver nanoparticles in the first resistive layer 5 return back to the second resistive layer 6 under the electric field effect, and the distribution of the silver nanoparticles in the resistive layers of the memristor is reconfigured again, so that the intensity and the phase of the modulated light are recovered. Obviously, in a period of the electrical modulation, a change degree of the optical-readout memristive synaptic weight has a one-to-one correspondence with the exerted voltage.

According to the first preferred embodiment, based on the vertical four-layer structure of metal/(double resistive layers)/metal of the memristor, combined with the three-layer structure of metal/($SiN_x$ dielectric layer)/metal of the surface plasmonic waveguide, the optical-readout of the synaptic weight is realized. Because the optical signals are able to be transmitted in parallel and have the large bandwidth, the optical-readout synaptic device with the amplitude and phase of the optical signals as the synaptic weight has the incomparable advantages over the conventional synaptic device with the resistance as the synaptic weight. More importantly, the surface plasmonic waveguide enables the optical signals to transmit with breaking the diffraction limit, which is beneficial to the further decrease of the device size.

Second preferred embodiment

The second preferred embodiment is different from the first preferred embodiment in that:

the first electrode layer 4 and the second electrode layer 7 both have a thickness of 20 nm;

the first resistive layer 5 is an intrinsic $SiO_xN_y$ film, which has a thickness of 50 nm and is obtained through a reactive magnetron sputtering method; and the second resistive layer 6 is a $SiO_xN_y$ film containing copper nanoparticles, which has a thickness of about 30 nm and a copper content of 45% (volume percentage) and is obtained through a co-sputtering method.

Third Preferred Embodiment

The third preferred embodiment is different from the first preferred embodiment in that:

the first electrode layer 4 and the second electrode layer 7 both have a thickness of 15 nm;

the first resistive layer 5 is an intrinsic $SiO_xN_y$ film, which has a thickness of 40 nm and is obtained through a reactive magnetron sputtering method; and the second resistive layer 6 is a $SiO_xN_y$ film containing aluminum nanoparticles, which has a thickness of about 20 nm and an aluminum content of 40% (volume percentage) and is obtained through a co-sputtering method.

The above preferred embodiments are exemplary only and merely for illustrating the principles and effects of the present invention, not for limiting the present invention. One skilled in the art can modify and change the above embodiments without departing from the spirit and scope of the present invention. Thus, all of the equivalent modifications and changes made by one skilled in the art without departing from the spirit and the technical thought of the present invention are encompassed within the following claims.

What is claimed is:

1. An optical-readout synaptic device based on $SiO_xN_y$, comprising a surface plasmonic waveguide and a memristor, wherein:

the surface plasmonic waveguide has a vertical three-layer structure that a second metal layer, a $SiN_X$ dielectric layer and a first metal layer are successively arranged from top to bottom;

the memristor has a vertical four-layer structure that a second electrode layer, a second resistive layer, a first resistive layer and a first electrode layer are successively arranged from top to bottom;

the memristor is embedded in the surface plasmonic waveguide, wherein: the first resistive layer and the second resistive layer of the memristor serve as an optical signal transmission channel that is horizontally connected with the $SiN_X$ dielectric layer of the surface plasmonic waveguide; and both of the first electrode layer and the second electrode layer of the memristor are made of the noble platinum electrodes, which are obtained through a physical vapor deposition method with a thickness of 10-20 nm and a width equal to a width of the surface plasmonic waveguide.

2. The optical-readout synaptic device based on $SiO_xN_y$, as recited in claim 1, wherein the first resistive layer is an intrinsic $SiO_xN_y$ film.

3. The optical-readout synaptic device based on $SiO_xN_y$, as recited in claim 2, wherein the first resistive layer is an intrinsic $SiO_xN_y$ film, which is obtained through a magnetron sputtering method and has a thickness of 30-50 nm.

4. The optical-readout synaptic device based on $SiO_xN_y$, as recited in claim 1, wherein: the second resistive layer is a $SiO_xN_y$ film containing metal nanoparticles; and the metal nanoparticles are silver nanoparticles, copper nanoparticles or aluminum nanoparticles.

5. The optical-readout synaptic device based on $SiO_xN_y$, as recited in claim 4, wherein: the second resistive layer is a $SiO_xN_y$ film containing the metal nanoparticles, which is obtained through a co-sputtering method combined with a standard CMOS (Complementary Metal-Oxide-Semiconductor) process and has a thickness of 10-30 nm; and a content of the metal nanoparticles is 30-45% of a volume of the $SiO_xN_y$ film.

6. The optical-readout synaptic device based on $SiO_xN_y$, as recited in claim 1, wherein both of the first metal layer and the second metal layer are silver layers.

7. The optical-readout synaptic device based on $SiO_xN_y$, as recited in claim 1, wherein a top part of the second electrode layer is located inside the second metal layer.

* * * * *